United States Patent [19]

De Brouckere

[11] 4,285,911
[45] Aug. 25, 1981

[54] DEVICE FOR GROWING A CRYSTALLINE LAYER ON A SUBSTRATE

[75] Inventor: Lucien C. De Brouckere, Blankenberge, Belgium

[73] Assignee: International Standard Electric Corporation, New York, N.Y.

[21] Appl. No.: 159,535

[22] Filed: Jun. 16, 1980

Related U.S. Application Data

[62] Division of Ser. No. 916,335, Jun. 15, 1978, Pat. No. 4,247,360.

[30] Foreign Application Priority Data

Jun. 17, 1977 [BE] Belgium ............................ 2/56006

[51] Int. Cl.³ ...................... C30B 15/30; C30B 35/00
[52] U.S. Cl. .................................. 422/249; 422/254
[58] Field of Search ................... 156/617 V, 618, 622, 156/624, DIG. 63, DIG. 65; 422/245, 249, 254

[56] References Cited

U.S. PATENT DOCUMENTS 3,228,753  1/1966  Larsen .................................. 422/249
3,615,262  10/1971  Kappelmeyer ...................... 156/618

OTHER PUBLICATIONS

"New Method of Stirring for LPE Growth"; J. of Crystal Growth; vol. 31; No. 1; 1975.

Primary Examiner—Bradley Garris
Attorney, Agent, or Firm—John T. O'Halloran; Alfred C. Hill

[57] ABSTRACT

A magnetic epitaxial layer containing the rare earths yttrium and samarium is grown on a gadolinium-gallium substrate which moves vertically in the melt during the growth process. The substrate remains immersed in a melt containing oxides of iron and the rare earths and while moving vertically in its own plane the substrate effectuates a translation movement with each point of the substrate describing a canted 8-shaped loop.

5 Claims, 7 Drawing Figures

DEVICE FOR GROWING A CRYSTALLINE LAYER ON A SUBSTRATE

CROSS-REFERENCE TO RELATED APPLICATION

This application is a division of application Ser. No. 916,335, filed June 15, 1978, now U.S. Pat. No. 4,247,360.

BACKGROUND OF THE INVENTION

This invention relates to a method to grow a crystalline layer on a substrate from a liquid medium, the substrate being moved with respect to the medium during the layer growth.

Such a method is known from the article "A New Method Of Stirring For LPE Growth" by J. C. Brice, J. M. Robertson and H. Van Der Heide of the Philips Laboratories at Eindhoven, published in the review "Journal of Crystal Growth" 30 (1975), pages 375 to 379. According to this known method for growing an epitaxial layer on a flat circular gadolinium-gallium substrate from a liquid medium or solution containing PbO, $B_2O_3$, $Y_2O_3$ and $Fe_2O_3$, this substrate is moved vertically in its own plane with respect to the liquid medium during the growth process of the layer. It should be reminded that this growth method has the advantage that when the substrate is withdrawn slowly from the solution upon the growth process being finished no droplets adhere to the grown surface thus avoiding the formation of mesastructures. More particularly, each point of the substrate surface describes a circumference the diameter $2b$ of which is smaller than the radius $a$ of the circular substrate so that a controlled liquid movement and a stirring of the solution is obtained. By proceeding in this way only a homogeneous layer of constant thickness is obtained on a central part of the circular substrate having a diameter $2a-4b$ so that b must be made as small as possible in order to obtain as large as possible a central portion with a constant layer thickness. However, by reducing b the stirring effect is also decreased. In the example described $2a=25$ millimeter and $b=3.4$ millimeter, so that the diameter of the above mentioned central part is smaller than half the diameter of the substrate.

SUMMARY OF THE INVENTION

It is an object of the present invention to provide a method by means of which it is possible to grow a crystalline layer on a substrate having a constant thickness on a portion of the substrate surface which is relatively larger than obtained with the known method.

A feature of the present invention is the provision of a method for growing a crystalline layer on a substrate from a liquid medium comprising the step of: moving the substrate with respect to the liquid medium during layer growth, the step of moving causing the direction of rotation of the substrate with respect to a fixed point to be reversed.

According to a further feature of the present invention the step of reversing the direction of rotation of the substrate includes the step of causing at least one point of the substrate to move in a loop-shaped path.

According to another feature of the present invention the substrate has a flat growth surface, the plane of which is situated the loop-shaped path, a part of which is situated outside the growth surface during the step of reversing the direction of rotation of the substrate.

According to still another feature of the present invention, the loop-shaped path includes at least two lobes, e.g. an 8-shaped loop, and when there are various loops, the various loops have a substantially common intersection.

In this way a continuous reversal of the direction of rotation of the substrate is obtained and a good stirring of the solution is realized during the crystalline layer growth. It is believed and experiments seem to indicate that these factors are important for growing a crystalline layer of constant thickness over a relatively large part of the substrate surface. Herewith, it is also avoided that the growth-velocity quickly decreases as a function of the duration of growth.

In a preferred method according to the present invention a magnetic crystalline layer, e.g. an epitaxial layer, is grown on a circular gadolinium-gallium substrate which during the growth process remains completely immersed in a solution containing iron oxide and oxides of rare earths, such as yttrium and samarium. An adequate mechanism transmits to the substrate a translation movement in such a way that each point of the substrate describes a canted 8-shaped figure the length of which is larger than the radius of the circular substrate.

BRIEF DESCRIPTION OF THE DRAWING

Above-mentioned and other features and objects of this invention will become more apparent by reference to the following description taken in conjunction with the accompanying drawing, in which.

DESCRIPTION OF THE PREFERRED EMBODIMENT

Figure 1:
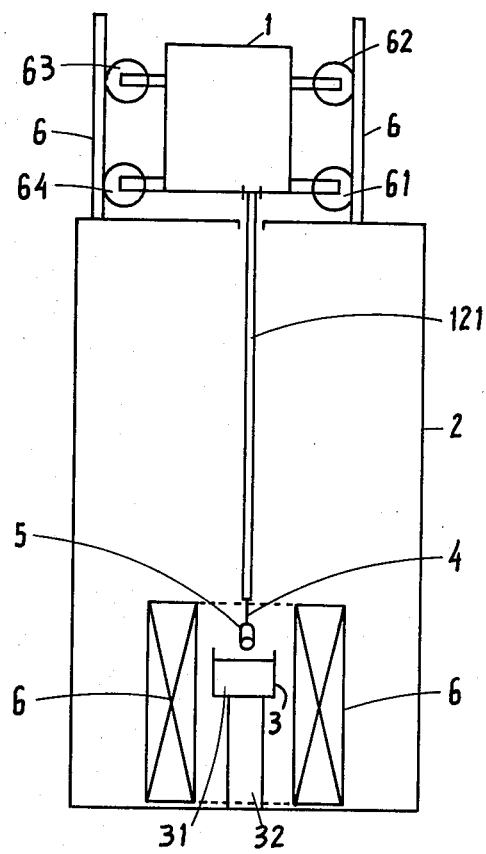
FIG. 1 is a schematic representation of a device for carrying out the method according to the principles of the present invention.

The device schematically shown in FIG. 1 consists of a growth oven which includes a mantle 2 whereon a mechanism 1 is mounted to move the substrate and which will be described later, a platinum crucible 3 with a solution 31 therein placed on a support 32 in aluminum oxide and a heating element 6 to heat the solution to the wanted temperature. Small wheels 61, 62, 63, 64 which are able to roll in the U-shaped rails 6 are secured to mechanism 1, which is provided with a bar 121 whereon a platinum fork 4 is mounted holding the substrate 5. In this way with the help of means not shown mechanism 1 may be vertically moved up and down.

Before carrying out the growth method the platinum crucible 3 is filled with the following substances in the quantities by weight (in grams) indicated: PbO:296.6, $B_2O_3$:5.931; $Fe_2O_3$:21.23; $Ga_2O_3$:3.563; $Sm_2O_3$:0.43; $Y_2O_3$:1.488. This composition is heated up to 1050° C.

and is stirred with the help of means not shown. Thereafter, the temperature of the bath or solution thus obtained is adjusted to a growth value equal to 958° C. which is situated approximately 10° C. below the saturation temperature of the bath composition. The saturation temperature is the temperature at which the growth velocity of a crystalline layer on the substrate is zero. Thereafter, mechanism 1 is lowered until the substrate arrives just above the bath level in the platinum crucible and the substrate is maintained in this position during a sufficiently long time interval to stabilize the whole at the growth temperature. The substrate is then plunged sufficiently deep into the solution to allow the substrate to remain in the solution during its translation movement which will be explained later.

During approximately ten minutes a magnetic epitaxial layer having the following chemical composition $(Sm, Y)_3 (Fe, Ga)_5 O_{12}$ and with a thickness of approximately 2.9 micrometer is grown. Finally, the substrate is withdrawn slowly vertically from the bath so that no residual droplets adhere thereto.

Figure 4:
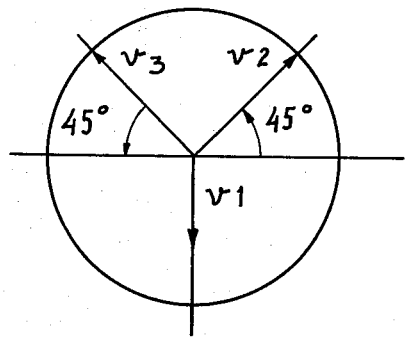
FIG. 4 shows the direction of the velocity of the movement along the 8-shaped path of FIG. 3.
Figure 2:
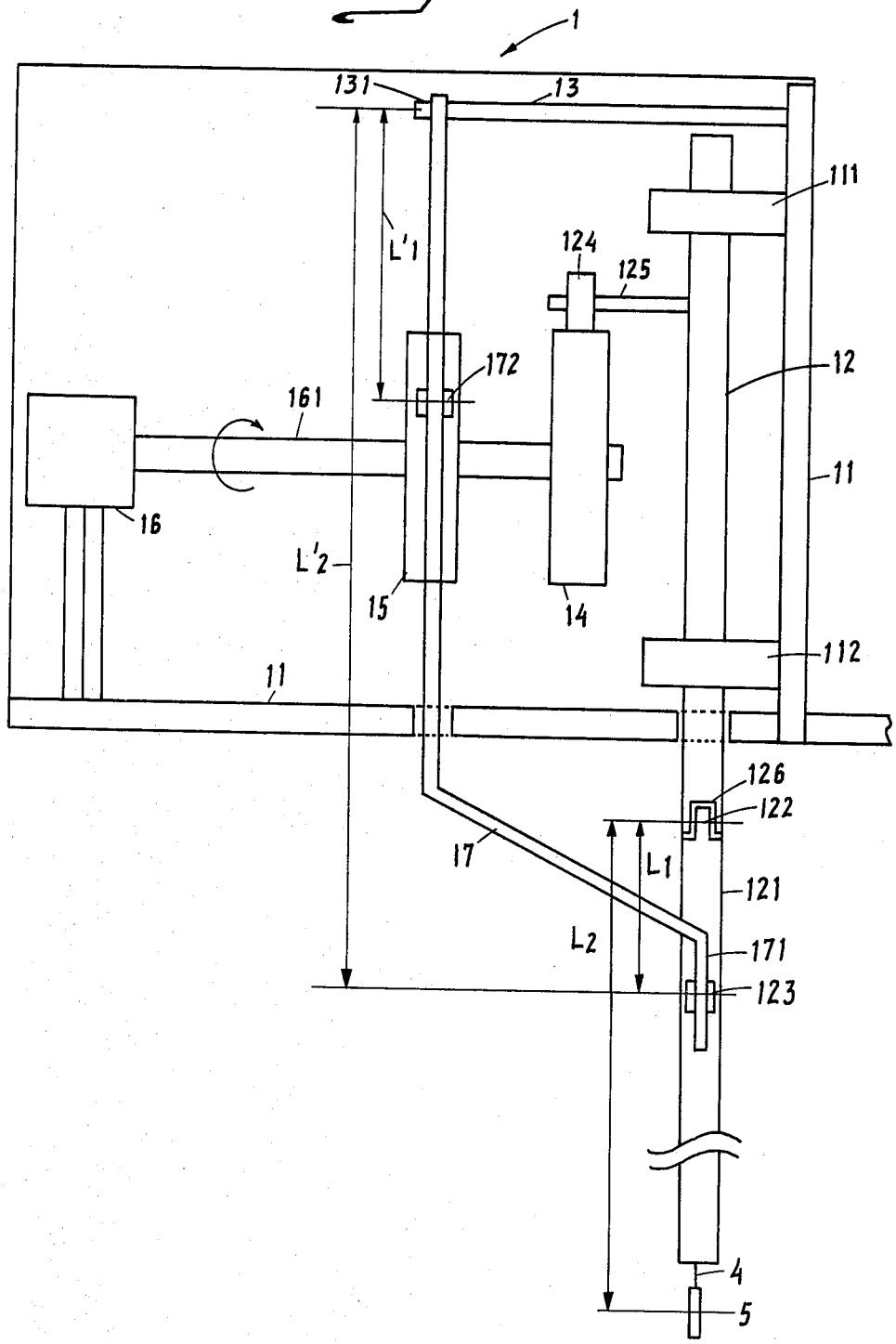
FIG. 2 represents a mechanism which forms part of the device of FIG. 1 which is used to move a substrate in the solution during the growth method according to the principles of the present invention.
Figure 3:
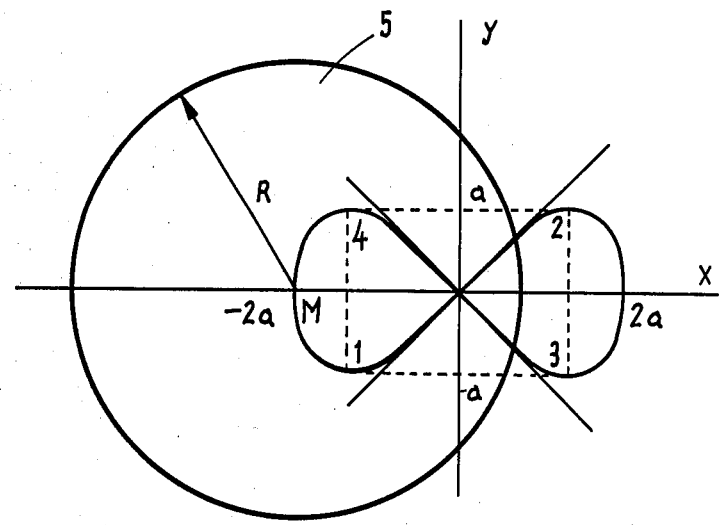
FIG. 3 represents an 8-shaped path described by the center of the circular substrate during its movement.
Figure 6:
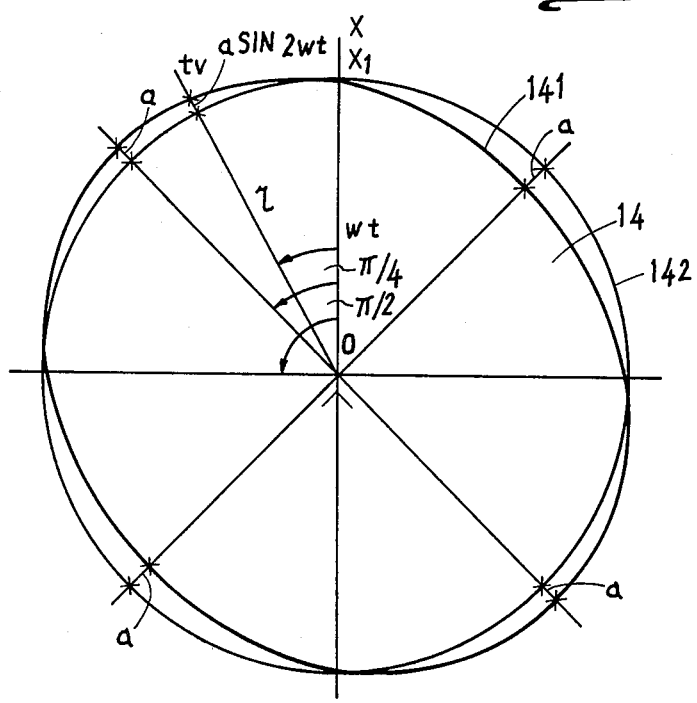
FIGS. 6 and 7 each show a cam profile which forms part of the mechanism of FIG. 2.
Figure 7:
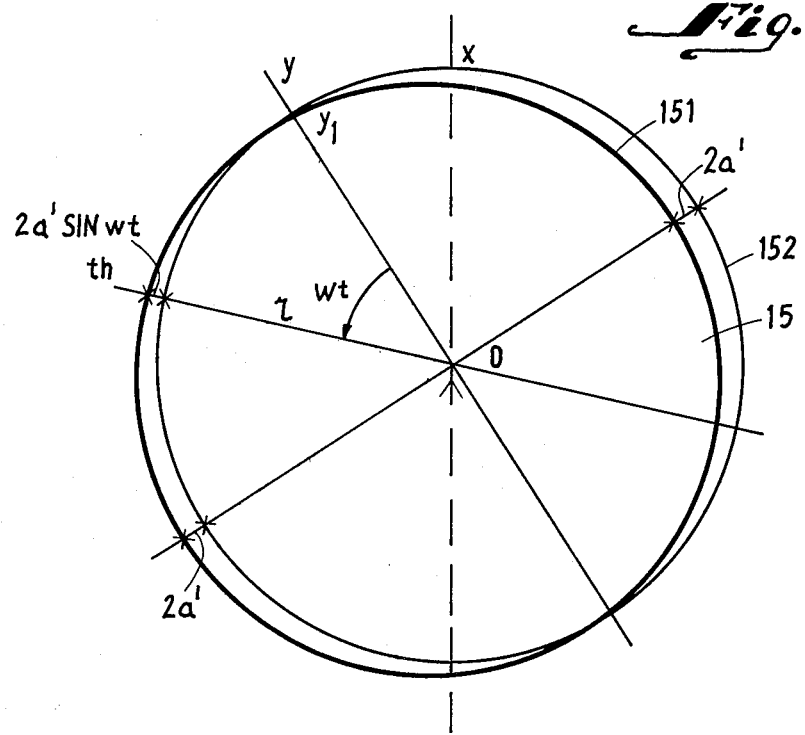

Mechanism 1 shown in FIG. 2 includes a frame 11. On this frame 11 are mounted guides 111 and 112, a drive motor 16 and a bar 13. A bar 12 which is able to slide up and downward in the guides 111 and 112 has a hinge 126 having an axle 122 whereabout the lower part 121 of bar 12 is able to oscillate and the upper part of the bar 12 is provided with a rod 125 carrying a follower 124. On the one hand the oscillating part 121 is provided with a guide 123 wherein the lower part 171 of a bar 17 is able to slide and on the other hand this oscillating part has a platinum fork 4 which carries the substrate 5. The bar 17 is able to oscillate about the end 131 of rod 13. The cams 14 and 15 are mounted on the axle 161 of motor 16, the cam follower 124 resting on the cam 14. A cam follower 172 mounted on the bar 17 is pressed against the cam 15 by means of a spring (not shown) connecting the bar 17 with the frame 11. During the movement of the cams 14 and 15 an up and down movement is communicated to the bar 12 via cam follower 124 and rod 125, while bar 17 experiences an angular displacement. This displacement is transmitted to the lower bar part 121 which is relatively long as can be derived from FIG. 1, so that a substantial linear horizontal translation movement is imparted to the substrate 5 when the cam 15 rotates around its axle 161. This horizontal movement has an amplitude of approximately $2a = 7$ millimeter. Since the amplitude of the horizontal movement of the guide 123, is equal to $2a.L1/L2$, wherein L1 and L2 are the distances from the axle 122 to the guide 123 and from this axle to the substrate center, respectively, and since the amplitude of the horizontal movement of the guide 123 is equal to this of the cam follower 172 multiplied by the ratio L'2/L'1, wherein L'1 and L'2 are the indicated lengths, the bar 17 will experience a small angular displacement during the movement of the cam 15. The cams 14 and 15 the profiles of which are shown in FIGS. 6 and 7 and which will be described later are designed in such a way that the horizontal (x) and vertical (y) components of the substrate movement are represented by the equations:

$$x = 2a \sin wt$$

$$y = a \sin 2wt$$

wherein 2 a, a and t are the amplitudes of these movements and the time, respectively, and wherein $w = 2\pi n/60$, n being the rotation speed of the motor 16 in revolutions per minute. In this way, each point of the substrate describes a canted 8-shaped Lissajous curve which is represented for the substrate center in FIG. 3 and which has orthogonal tangents in the point $x = y = 0$. In FIG. 3, there is also shown the circular substrate 5 having a radius R. When for instance the substrate center moves on this loop from point M along parts 1, 2, 3 and 4 the velocity vector changes as indicated in FIG. 4. The direction of this vector changes from v1 to v2 in clockwise direction, from v2 and v1 in anticlockwise direction, from v1 to v3 in clockwise direction and then from v3 to v1 in anticlockwise direction.

It should be noted that the invention is not restricted to the example mentioned above wherein the movement is composed of two harmonic functions. The movement may also be composed of two non-harmonic functions. The cams can, for example, be designed in order to describe a curve with different nodes or a clover-leaf-shaped loop having four leaves. Also, instead of an 8-shaped Lissajous curve, two tangent circles can be described. In this case the direction of the movement changes each time over an 180° angle when the parts 1, 2, 3 and 4 are described.

Figure 5:
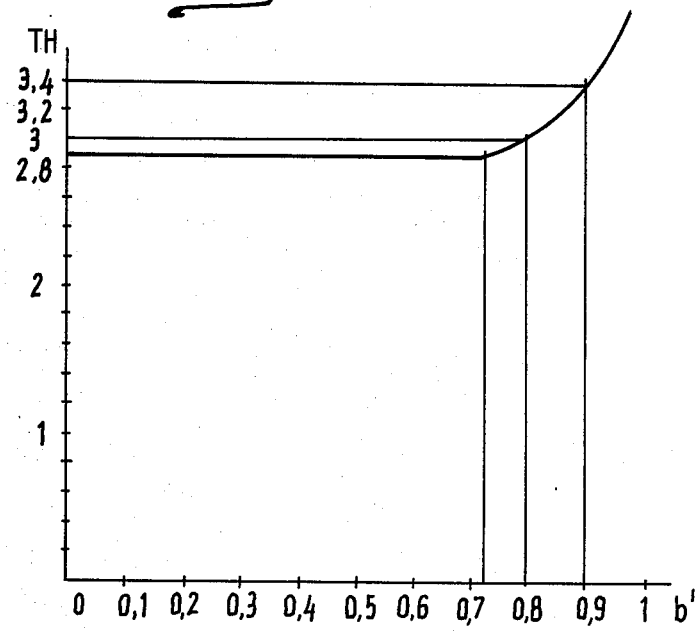
FIG. 5 shows a curve representing the thickness of a grown epitaxial layer as a function of the relative substrate diameter.

FIG. 5 shows the thickness TH of the grown epitaxial layer on each point of the circular substrate as a function of the ratio b' of the distance of this point to the center of the substrate and the radius R thereof, more particularly for a substrate diameter of approximately 19 millimeter, and for an amplitude a of the translation movement equal to 3.5 millimeter. The rotation speed of $n = 85$ rpm and the layer growth time is approximately 10 minutes. The zone with constant layer thickness with a tolerance of $+5\%$ is a circular domain with relative radius equal to 8.

The profiles of the cams 14 and 15 shown in the zero position $(x = y = 0)$ in FIGS. 6 and 7 rotate in clockwise direction about their rotation centers O. These rotation centers are situated on the axes of the axle 161 whereon the cams are mounted orthogonally. In this zero position the cam followers 124 and 172 rest at X1 and Y1 on cams 14 and 15, these points determining the reference axes OX and OY, respectively. The profile 141 of cam 14 is obtained by adding the value $a \sin 2 wt$ to the value of the radius r of the circle 142 on each time-axis tv which makes an angle wt with the reference axis OX. Similarly the profile 151 of the cam 15 is obtained by adding the value $2a' \sin wt$ to the value of the radius r of the circle 152 on each time-axis th which forms an angle wt with the reference axis OY. The value $2a'$ which is drawn exaggerated is in practice much smaller than $2a$ since as mentioned earlier $2a' = 2a$ L'1/L'2 . L1/L2 so that the drawn profile 151 approximates the circumference very closely.

In the table herebelow values of wt between 0 and $2\pi$ and the corresponding values of $y = a \sin 2$ wt and $x' = 2a' \sin wt$ are given:

| wt | x' | 2wt | y |
|---|---|---|---|
| 0 | 0 | 0 | 0 |
| $\pi/4$ | $a'\sqrt{2}$ | $\pi/2$ | a |
| $\pi/2$ | $2a'$ | $\pi$ | 0 |
| $3\pi/4$ | $a'\sqrt{2}$ | $3\pi/2$ | $-a$ |
| $\pi$ | 0 | $2\pi$ | 0 |
| $5\pi/4$ | $-a'\sqrt{2}$ | $5\pi/2$ | a |
| $3\pi/2$ | $-2a'$ | $3\pi$ | 0 |
| $7\pi/4$ | $-a'\sqrt{2}$ | $7\pi/2$ | $-a$ |
| $2\pi$ | 0 | $4\pi$ | 0 |

It is also obvious that the substrate movement can also be obtained, for instance, by means of two cams which are not mounted on the same axle the first one rotating at double angular speed of the second one. More particularly, the second cam can then be used to control the horizontal movement by moving a pusher which itself moves the oscillating bar 121, while the first cam controls the vertical movement. In this case cams of the type 15 can be used.

While I have described above the principles of my invention in connection with specific apparatus it is to be clearly understood that this description is made only by way of example and not as a limitation to the scope of my invention as set forth in the objects thereof and in the accompanying claims.

I claim:

1. A device for growing a crystalline layer on a substrate from a liquid medium, said substrate being moved with respect to said liquid medium during layer growth such that the direction of rotation of said substrate with respect to a fixed point is reversed and causing at least one point of said substrate to move in a loop-shaped path, said device comprising:

a mechanism to impart two substantially rectilinear movements to said substrate to cause said movement thereof including a slidably mounted bar to which one of said two rectilinear movements is imparted, said bar having a prolonged part hingedly connected thereto, said prolonged part having the other of said two rectilinear movements imparted thereto.

2. A device according to claim 1, further including a guide fixed to said prolonged part; and an oscillating bar having one of its ends slidable in said guide;

said guide and said oscillating bar imparting said other of said two rectilinear movements to said prolonged part.

3. A device according to claim 2, further including a pair of cams, one of said pair of cams imparting movement to said slidably mounted bar and the other of said cams imparting movement to said oscillating bar.

4. A device according to claim 3, wherein said cams are mounted on a common axle and rotate at the same angular speed.

5. A device according to claim 3, wherein each of said cams rotate at a different angular speed.

* * * * *